(12) United States Patent
Kraus et al.

(10) Patent No.: US 7,957,146 B2
(45) Date of Patent: Jun. 7, 2011

(54) ILLUMINATION DEVICE COMPRISING A SUBSTRATE PLATE AND A HEAT SINK

(75) Inventors: Robert Kraus, Regensburg (DE); Steffen Straub, Regensburg (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 0 days.

(21) Appl. No.: 12/290,765

(22) Filed: Nov. 3, 2008

(65) Prior Publication Data

US 2009/0129025 A1 May 21, 2009

(30) Foreign Application Priority Data

Nov. 16, 2007 (DE) .......................... 10 2007 054 856

(51) Int. Cl.
*H05K 7/20* (2006.01)

(52) U.S. Cl. .................... 361/709; 361/679.54; 361/703; 361/710; 361/719; 165/80.2; 165/80.3; 165/104.33; 257/712; 257/713; 257/717; 257/720; 362/218; 362/294; 362/373

(58) Field of Classification Search ............. 361/679.46, 361/679.54, 702–712, 715–720; 362/218, 362/294, 373, 800, 545, 555, 249, 235, 547; 372/36; 257/699, E23.098, 704, 712–717, 257/720, 675, E23.002, E21.567, E21.568; 174/15.1, 16.3, 252; 165/80.3, 104.33, 185
See application file for complete search history.

(56) References Cited

U.S. PATENT DOCUMENTS

| | | | | | |
|---|---|---|---|---|---|
| 4,152,175 A | * | 5/1979 | Burgess et al. | ............... | 136/259 |
| 4,485,405 A | * | 11/1984 | Bailey | ......................... | 348/230.1 |
| 4,567,505 A | * | 1/1986 | Pease et al. | .................... | 257/713 |
| 4,568,586 A | * | 2/1986 | Gobrecht | ......................... | 428/49 |
| 4,620,216 A | * | 10/1986 | Horvath | ......................... | 257/713 |
| 4,821,051 A | * | 4/1989 | Hediger | ......................... | 347/130 |
| D304,715 S | * | 11/1989 | Horvath et al. | ............. | D13/179 |
| 4,926,935 A | * | 5/1990 | Haushalter | .................... | 165/185 |
| 5,051,814 A | * | 9/1991 | Paal | ............................ | 257/714 |
| 5,235,347 A | * | 8/1993 | Lee | ............................... | 347/238 |
| 5,751,552 A | * | 5/1998 | Scanlan et al. | ................ | 361/707 |
| 5,812,570 A | * | 9/1998 | Spaeth | ........................... | 372/36 |
| 5,848,083 A | * | 12/1998 | Haden et al. | ..................... | 372/36 |
| 5,857,767 A | * | 1/1999 | Hochstein | .................... | 362/294 |
| 5,893,409 A | * | 4/1999 | Kohler et al. | ................. | 165/80.3 |
| 5,894,882 A | * | 4/1999 | Kikuchi et al. | .............. | 165/80.3 |
| 6,043,985 A | * | 3/2000 | Azdasht et al. | ................ | 361/707 |

(Continued)

FOREIGN PATENT DOCUMENTS

JP 3138726 U * 1/2008

*Primary Examiner* — Michael V Datskovskiy
(74) *Attorney, Agent, or Firm* — Holtz, Holtz, Goodman & Chick PC

(57) ABSTRACT

The invention relates to an illumination device (1) comprising at least one preferably ceramic substrate plate (2), at least one luminous element (3) arranged on a front side (A) of the substrate plate (2) in particular at least one light emitting diode (LED) (3), and at least one preferably metallic heat sink (4) connected, in particular adhesively bonded and/or soldered, to a rear side (B) of the substrate plate (2) over a large area, wherein the coefficients of thermal expansion of substrate plate (2) and heat sink (4) differ at least by the factor 1.5, in particular by a factor greater than 2. The heat sink (4) has at least one preferably linear recess (6) on its side facing the rear side (B) of the substrate plate (2).

21 Claims, 3 Drawing Sheets

U.S. PATENT DOCUMENTS

| | | | |
|---|---|---|---|
| 6,208,517 B1 * | 3/2001 | Prince et al. | 361/704 |
| 6,244,332 B1 * | 6/2001 | Gesklin et al. | 165/80.3 |
| 6,695,027 B2 * | 2/2004 | Hashimoto | 156/351 |
| 6,830,960 B2 * | 12/2004 | Alcoe et al. | 438/122 |
| 6,895,027 B2 * | 5/2005 | Treusch et al. | 372/36 |
| 7,067,393 B2 * | 6/2006 | Letertre et al. | 438/455 |
| 7,085,135 B2 * | 8/2006 | Chu et al. | 361/704 |
| 7,210,930 B2 * | 5/2007 | Kovac et al. | 433/29 |
| 7,279,779 B2 * | 10/2007 | Letertre et al. | 257/669 |
| 7,355,853 B2 * | 4/2008 | Emoto et al. | 361/704 |
| 7,363,964 B2 * | 4/2008 | Lin et al. | 165/80.3 |
| 7,492,599 B1 * | 2/2009 | Yu et al. | 361/719 |
| 7,637,628 B2 * | 12/2009 | Budike | 362/247 |
| 2008/0037602 A1 * | 2/2008 | Thiagarajan et al. | 372/36 |

* cited by examiner

ILLUMINATION DEVICE COMPRISING A SUBSTRATE PLATE AND A HEAT SINK

TECHNICAL FIELD

The invention relates to an illumination device comprising at least one preferably ceramic substrate plate, at least one luminous element arranged on a front side of the substrate plate in particular at least one light emitting diode (LED), and at least one preferably metallic heat sink connected, in particular adhesively bonded and/or soldered, to a rear side of the substrate plate over a large area, wherein the coefficients of thermal expansion of substrate plate and heat sink differ at least by the factor 1.5, in particular by a factor greater than 2.

PRIOR ART

Luminous elements, in particular including light emitting diodes, often generate during operation large amounts of heat that have to be reliably dissipated for safe and permanent operation. If the luminous elements are applied on the top side of an electrically nonconductive substrate plate, the heat dissipation is usually effected via a heat sink arranged on the rear side of the substrate plate. Owing to the good thermal conductivity, heat sinks are usually produced from metal and can have additional devices for better heat dissipation, such as, for example, fans or cooling channels for a cooling fluid to flow through.

In order to enable a good heat transfer from the substrate plate to the heat sink, the heat sink is usually connected to the substrate plate over the whole area, in particular adhesively bonded or soldered by means of a connecting layer. What is disadvantageous about arrangements of this type, however, is the high thermally induced mechanical stresses in the substrate plate, the heat sink and also the connecting layer possibly situated in between, which result from the different coefficients of thermal expansion of the individual components. Even if the thermally induced stresses can be compensated for to a limited extent by means of the connecting layer, these stresses nevertheless limit the maximum size of the heat sink currently to diagonal dimensions of approximately 10 mm.

SUMMARY OF THE INVENTION

The object of the present invention is to provide an illumination device comprising at least one preferably ceramic substrate plate, at least one luminous element arranged on a front side of the substrate plate in particular at least one light emitting diode (LED), and at least one preferably metallic heat sink connected, in particular adhesively bonded and/or soldered, to a rear side of the substrate plate over a large area, wherein the coefficients of thermal expansion of substrate plate and heat sink differ at least by the factor 1.5, in particular by a factor greater than 2.

This object is achieved by means of the characterizing features of claim 1. Particular advantageous configurations are found in the dependent claims.

By virtue of the heat sink having at least one preferably linear recess on its side facing the rear side of the substrate plate, there is the possibility of at least partly compensating for the different thermal expansions of heat sink and substrate plate in that the segments of the heat sink which adjoin the sides of the recess can expand in a direction of the recess. In this case, recesses regarded as linear are those which, in each case measured in the plane of the substrate plate, have in one direction at least double the extent, in particular a more than 5-fold extent, preferably even more than 10-fold extent, by comparison with the extent in a direction oriented through 90° relative thereto.

In an expedient development of the invention, at least two segments of the heat sink are provided which are completely separated from one another by at least one preferably linear recess in the connecting plane with respect to the substrate plate. As a result, for example locally different conditions on the substrate plate can be taken into account by virtue of regions of the substrate plate with significantly different loads in each case being allocated dedicated segments of the heat sink. It goes without saying that the segments can be connected to one another in a different plane than the connecting plane with respect to the substrate plate, for example at the bottom of the recess.

It is furthermore expedient if the preferably linear recess extends from one side face of the heat sink to another side face of the heat sink. This ensures that a sufficient possibility of compensation for the different thermal expansions of substrate plate and heat sink is provided in edge regions of the heat sink as well. The interface between the heat sink and the substrate plate can thus moreover simply be subdivided into at least two segments. Furthermore, air can flow through the recess and thus support the cooling effect of the heat sink.

It is particularly advantageous if the heat sink has at least two linear recesses. It is thereby possible to perform a particularly effective subdivision of the interface of the heat sink into a plurality of segments.

By virtue of the fact that at least two linear recesses are arranged at least in sections at an identical distance from one another, a particularly simple construction is obtained and the segment situated between the recesses has approximately homogeneous conditions as a result of its homogeneous width.

It is likewise advantageous if at least one linear recess is formed in rectilinear fashion at least in sections. A rectilinear formation can be produced in a simple manner. As a result of the simple geometrical conditions, moreover, the properties of the illumination device can be predicted in a simple manner, whereby for example limit values for safe operation can be defined in a simple manner. Furthermore, in the case of a rectilinear recess, the throughflow with air is possible in a particularly simple and low-resistance manner, whereby an effective additional cooling can be achieved.

By virtue of the fact that at least two linear recesses have at least one point of intersection, an advantageous embodiment of the invention is likewise obtained since compensation of the different thermal expansions of the components in different directions is made possible particularly well in this way. A subdivision of the heat sink into a plurality of segments can also be produced in a simple manner in this way.

It is particularly advantageous if the at least two segments of the heat sink which are completely separated from one another are connected to a common basic body. In this case, basic body should be understood to mean any form of approximately planar body which extends substantially over the entire area of the heat sink. A common basic body enables a particularly effective dissipation of the heat from the segments at the interface with the substrate plate, wherein at the same time the mounting of the heat sink is facilitated and a simple thermal compensation between the segments is also made possible.

In addition, it is advantageous if at least one segment of the heat sink and the common basic body are formed in one piece. This enables a particularly simple production and handling of the heat sink. The thermal linking between the basic body and the segment adjoining the substrate plate is moreover particularly good with this design.

Expediently, the linear dimensions of a segment of the heat sink in the connecting plane with respect to the substrate plate independently of the measurement direction are less than 20 mm, preferably less than 10 mm, particularly preferably less than 5 mm. As a result, the stresses in the individual segments and also in the substrate plate are reduced to a noncritical amount.

It is likewise advantageous if at least one of the segments is connected to the basic body by means of a mechanical connecting element. The mechanical connection can be effected for example by means of plug, screw or rivet connections. As a result, the two components can be separated from one another or connected to one another in a simple manner. This also makes it possible, using identical individual components, to construct heat sinks having different configurations and thus to adapt them to different substrate plates.

Furthermore, it is expedient if at least one of the segments is connected to the basic body by means of an adhesive bonding connection. Adhesive bonding connections can be produced in a simple manner and make it possible, in a particularly simple manner, using identical individual components, to construct heat sinks having different configurations and thus to adapt them to different substrate plates.

It is expedient if at least one segment of the heat sink has a rectangular, in particular square, outer contour in the connecting plane with respect to the substrate plate. Contours of this type can be produced in a simple manner.

In a further expedient configuration of the invention, at least one segment of the heat sink has an elliptical, in particular circular, outer contour in the connecting plane with respect to the substrate plate. Outer contours of this type can likewise be produced in a simple manner and are advantageous in particular in the case of throughflow with a fluid on account of the lack of corners and edges.

It is particularly advantageous if at least one segment of the heat sink has at least one recess which is not connected to the substrate plate. Recesses of this type are particularly suitable for achieving an additional throughflow of a cooling fluid through the heat sink.

It is likewise particularly advantageous if at least one segment is formed in approximately U-shaped fashion, wherein the opening of the U is remote from the substrate plate. This provides a recess in the heat sink which permits a good throughput of a cooling fluid, while a good thermal linking of the heat sink to the substrate plate is ensured at the same time.

In a particularly advantageous configuration of the invention, the heat sink is formed at least partly from bent sheet metal. This enables both a simple production, particularly in the case of U-shaped segments of the heat sink, and a good circulation of cooling air.

Expediently, the heat sink is formed substantially from aluminum and/or an aluminum alloy. Aluminum has a high fill conductivity, is light and can be processed simply and cost-effectively.

It is furthermore expedient if the heat sink is formed substantially from copper and/or a copper alloy. Copper has a high thermal conductivity and is therefore particularly well suited to heat sinks. Moreover, the thermal expansion is smaller than in the case of aluminum.

In a further advantageous development of the invention, the substrate plate is formed substantially from $Al_2O_3$ and/or AlN. These materials are electrically insulating, have good mechanical properties and can be produced relatively cost-effectively. Moreover, AlN has a relatively good thermal conductivity.

BRIEF DESCRIPTION OF THE DRAWINGS

The invention will be explained in more detail below on the basis of exemplary embodiments. In the figures.

The elements illustrated and the size relationships among one another should not be regarded as true to scale, in principle; rather, individual elements such as, for example, layers, structural parts, components and regions may be illustrated with an exaggerated thickness or size dimensions for the sake of better representability and/or for the sake of a better understanding.

Preferred Embodiment of the Invention

Figure 1:
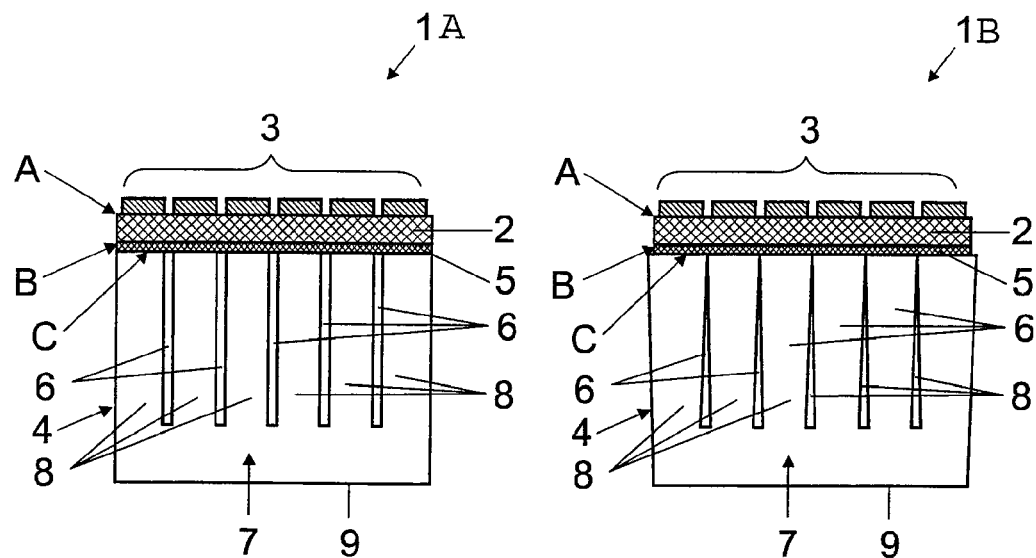
FIG. 1 shows a first embodiment of an illumination device according to the invention in a lateral sectional view illustration.

FIG. 1 shows a first embodiment of an illumination device 1A, 1B according to the invention in a lateral sectional view illustration, wherein the illumination device 1A is illustrated in a cold state on the left, while conditions upon reaching the operating temperature are represented on the right 4B. Here as in all the figures, in particular the height of the illumination device 1A-1E and also the extent of the thermal expansions are illustrated in a greatly exaggerated manner.

The illumination device 1A-1B essentially comprises a substrate plate 2, light emitting diodes (LEDs) 3 as luminous elements being arranged on the front side A of said substrate plate. A heat sink 4 is adhesively bonded over a large area on the rear side B of the substrate plate 2 by means of a connecting layer 5.

The heat sink 4 is produced from an aluminum alloy, while the substrate plate 2 is formed from $Al_2O_3$. The coefficient of thermal expansion for $Al_2O_3$ is approximately $6.8*10^{-6}$/K, while aluminum typically has a value of $24*10^{-6}$/K. The connecting layer is formed as an adhesive bonding connection based on epoxy resin.

The heat sink 4 is pervaded by linear recesses 6 at the interface C with the substrate plate 2, said recesses extending rectilinearly in each case from a side face 7 of the heat sink 4 to an opposite side face (not visible here). In the present exemplary embodiment, the recesses 6 are arranged equidistantly and parallel to one another.

Further parallel linear recesses (likewise not visible here) are arranged orthogonally with respect thereto, which recesses intersect the recesses 6 at an angle of approximately 90° and are likewise arranged equidistantly among one another, thus resulting in individual square segments 8 of the heat sink 4 which are connected to the substrate plate 2.

The segments 8 are interconnected by means of a common basic body 9, wherein the segments 8 and the basic body 9 are embodied in one piece in the exemplary embodiment shown. As a result, the heat sink 4 can be produced simply and cost-effectively, for example as a cast component, or by virtue the recesses 6 being worked from a parallelepipedal block by suitable machining, for example sawing.

If the LEDs 3 become warm during operation, then both the substrate plate 2 and the heat sink 4 expand, which is illustrated in a greatly exaggerated manner on the right-hand side of FIG. 1. The heat sink 4 has a temperature gradient perpendicular to the surface B of the substrate plate 2, such that the thermal expansion is smaller in the region of the basic body 9 than near the interface C with the substrate plate 2, where substrate plate 2 and heat sink 4 are at practically the same temperature. By means of the linear recesses 6, the expansion of the segments 8 of the heat sink 4 parallel to the surface B is practically not impeded; in particular, the overall expansion of the heat sink 4 in the region of the interface C is significantly smaller than would be the case for a heat sink without the recesses 6 according to the invention, since the recesses 6 act virtually as expansion joints.

In this case, the width and also the depth of the recesses 6 are chosen such that, on the one hand, there is sufficient space available for the thermal expansion of the adjacent segments 8, and, on the other hand, a sufficient heat transport away from the substrate plate 2 is ensured. Furthermore, the differences in thermal expansion between the basic body 9 and the segments 8 have been taken into account particularly in the choice of the depth of the recesses 6, such that the expansion of the basic body 9 approximately corresponds to that of the substrate plate 2.

Figure 2:
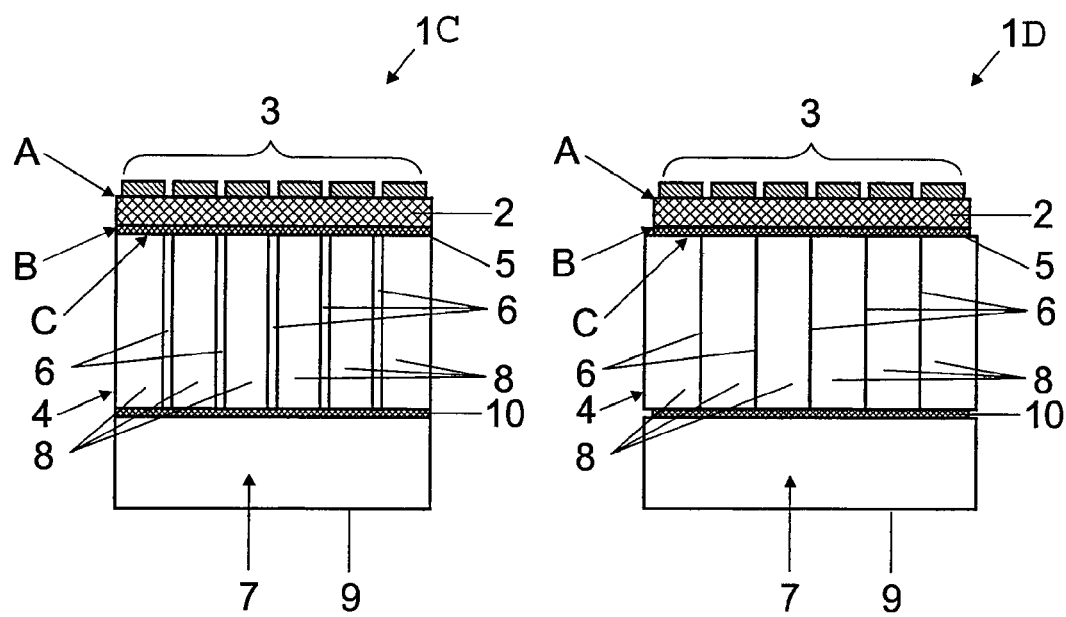
FIG. 2 shows a second embodiment of an illumination device according to the invention in a lateral sectional view illustration.

A further example of an illumination device according to the invention is illumination device 1C, 1D shown in FIG. 2. This figure once again shows the state with the device switched off on the left (1C) and at operating temperature on the right (1D). The basic construction of the illuminating device 1C, 1D comprising LEDs 3, a substrate plate 2, a connecting layer 5 and a heat sink 4 essentially corresponds to the illuminating device 1A, 1B shown in FIG. 1.

In this exemplary embodiment, however, the segments 8 of the heat sink 4 which are in contact with the substrate plate 2 are connected to the basic body 9 by means of a further connecting layer 10. In the exemplary embodiment shown, the connecting layer 10 is formed from an adhesive based on epoxy resin. The recesses 6 are embodied analogously to the previous exemplary embodiment, that is to say as two groups of rectilinear grooves arranged equidistantly, of which one group intersects the other at an angle of 90°, such that the individual segments 8 have a square outer contour.

If the illumination device 1C, 1D is in the operating state, as illustrated on the right in FIG. 2 (1D), the segments 8 can expand, wherein the width of the recesses 6 is reduced. The connecting layer 10 between the segments 8 and the basic body 9 significantly reduces the stresses in this part of the heat sink 4 by comparison with the one-piece embodiment in accordance with the first exemplary embodiment. Moreover, heat sinks 4 in accordance with this exemplary embodiment can easily be produced in different sizes or forms by using a basic body 9 of suitable size or form and equipping it with standardized segments 8.

Figure 3:
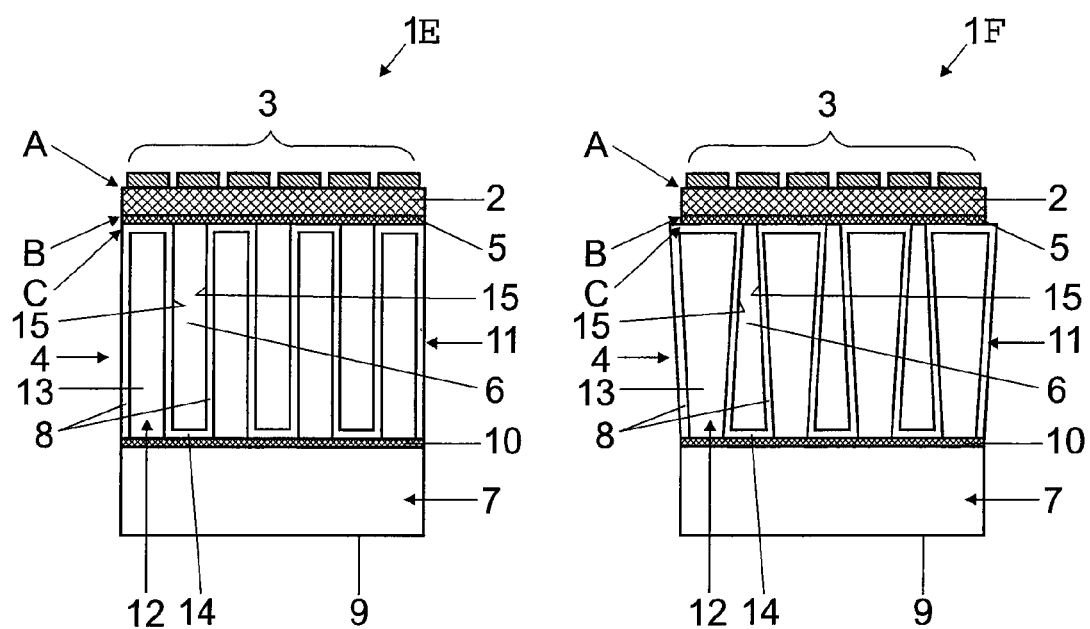
FIG. 3 shows a third embodiment of an illumination device according to the invention in a lateral sectional view illustration.
Figure 4:
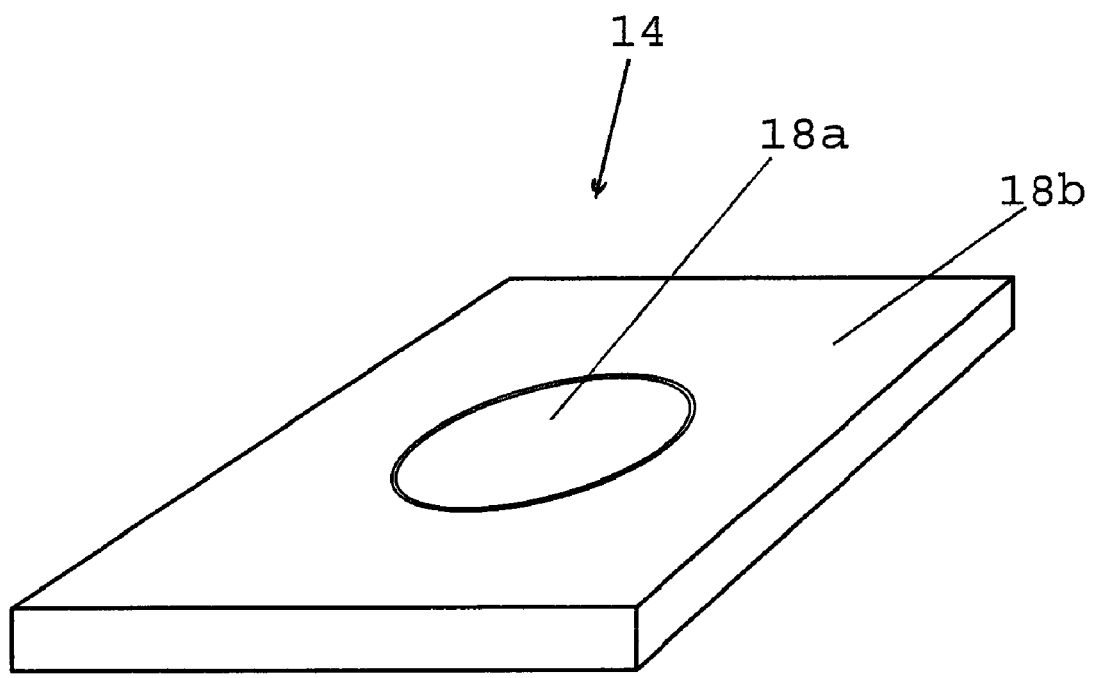
FIG. 4 shows an embodiment of a heat sink having a circular outer contour and two sections.

A further embodiment of the invention is shown in FIG. 3. This differs from the previous exemplary embodiments by virtue of the configuration of the heat sink 4. An adaptor 11 is arranged on a basic body 9, said adaptor in turn being connected to the substrate plate 2 by means of a connecting layer 5.

In illumination device 1E, 1F the adaptor 11 is bent from sheet metal, wherein the individual segments 8 connected to the substrate plate 2 are formed in U-shaped fashion and the opening 12 of the recess 13 forming the U points away from the substrate plate 2. The segments 8 are in turn connected to one another via connecting parts 14, whereby rectangular recesses 6 according to the invention are formed which pervade the heat sink 4, thus resulting overall in a lamellar construction of the adaptor 11.

In addition, the connecting parts 14 are connected to the basic body 9 via a connecting layer 10, wherein the connecting layers 5, 10 are embodied as soldering connections in this exemplary embodiment. In the exemplary embodiment shown, the recesses 6 are rectilinear and extend from one side face 7 of the heat sink 4 to the other. No recesses 6 are provided in the transverse direction, whereby this construction is suitable in particular for substrate plates 2 whose expansion in one direction (here in the plane of the drawing) is significantly greater than perpendicularly thereto (and thus perpendicularly to the plane of the drawing). In the case of square substrate plates 2, it is possible to use a plurality of lamellar adaptors 11 arranged in a manner spaced apart from one another, such that the interspaces again form linear recesses 6.

At operating temperature, the state shown on the right (1E) in FIG. 3 schematically arises, wherein the adaptor 11 of the heat sink 4 experiences its maximum expansion at the interface C with the substrate plate 2. Regions situated at a deeper level, in particular the connecting parts 14 and the basic body 9, by contrast, almost do not expand at all. The relatively small wall thickness of the adaptor 11 produced from sheet metal contributes to the fact that firstly the mechanical loading for the connecting layer 10 is reduced, and that secondly the differences in the thermal expansions within the heat sink 4, which result from the temperature gradient prevailing there, are also absorbed by the deformation of the side walls 15 of the recesses 6.

In addition, in this exemplary embodiment, that cross-sectional area of the heat sink 4 through which cooling air can flow does not decrease as the temperature increases, since, with the reduction of the cross section of the recesses 6 as a result of the thermal expansion of the parts 16 of the adaptor 11 which are arranged at the interface C with the substrate plate 2, the cross section of the U-shaped segments 8 simultaneously widens. Consequently, the in any case good supply of a cooling medium in this embodiment of the invention remains approximately the same in all operating states. With this design, with the same adaptor 11, the form of the basic body 9 can be adapted to the application, that is to say that for example the thickness of the basic body 9 can vary or the basic body 9 can even be completely dispensed with.

It goes without saying that embodiments of the invention other than those shown in the exemplary embodiments are also conceivable. Thus, in particular the form of the recesses 6 and therefore also, if appropriate, that of the segments 8 of the heat sink 4 which are separated from one another by the recesses 6 can deviate significantly from the forms shown, depending on the application. In this case, the form and dimensions of the segments 8 depend principally on the distribution and intensity of the luminous elements 2 and of other heat sources on the substrate plate 2.

In particular, it is conceivable for the recess 6 not to be led in rectilinear fashion, but rather in circular or elliptical fashion, and thus for one or a plurality of circular segments 8 to be provided which are assigned for example to individual heat sources, such as LEDs 3 or LED clusters. Embodiments in which linear recesses 6 intersect at an angle that deviates from 90° are also conceivable.

The dimensions of the recesses 6 are defined on the basis of the requirements; in general, it is expedient to keep the width as small as possible in order that the heat sink 4 can be linked to the substrate plate 2 over a largest possible area. However, the side walls 15 of the recesses 6 need not necessarily run perpendicular to the substrate plate 2; in particular, recesses 6 that taper or widen toward the base are conceivable in order for example to set a specific temperature gradient in the heat sink 4 or to compensate for the locally different thermal expansions.

The basic body 9 can furthermore be connected to the adaptor 11 or the segments 8 by means of one or more mechanical connecting elements. A multiplicity of possibilities, such as, for example, screw connections, clamping, shrink, plug or sliding connections, are known to the person skilled in the art for this purpose.

The configuration of the basic body 9 can also deviate considerably from the simple parallelpepiped illustrated here; in particular, recesses that are not connected to the substrate plate 2, for example in the form of cooling channels, can also be provided in the basic body 9. In particular, the heat sink 4 can have cooling fins on the side remote from the substrate plate 2, said cooling fins likewise defining recesses.

Instead of aluminum, another material having good thermal conductivity can also be used for the heat sink 4, in particular copper or a copper-based alloy. Furthermore, it is also conceivable to produce the basic body 9 of the heat sink 4 from a different material than the segments 8 and/or the adaptor 11.

For the substrate plate 2, too it is possible to use all materials that are known to the person skilled in the art for applications of this type. Alongside $Al_2O_3$, this is AlN, in particular, on account of it high thermal conductivity.

The connecting layers 5, 10 serve not only for interconnecting the adjacent components but also for compensating for their different thermal expansions. At the same time, a good thermal conductivity is advantageous. A multiplicity of possible adhesive bonding or soldering connections according to the prior art for the connection of electronic components are known to the person skilled in the art for this purpose.

The invention claimed is:

1. An illumination device (1) comprising at least one substrate plate (2), at least one luminous element (3) arranged on a front side (A) of the substrate plate (2), and at least one heat sink (4) connected to a rear side (B) of the substrate plate (2) over a large area, wherein the coefficients of thermal expansion of substrate plate (2) and heat sink (4) differ at least by the factor 1.5, characterized in that the heat sink (4) has at least one recess (6) on its side facing the rear side (B) of the substrate plate (2).

2. The illumination device (1) as claimed in claim 1, wherein at least two segments (8) of the heat sink (4) are provided which are completely separated from one another by at least one linear recess (6) in the connecting plane with respect to the substrate plate (2).

3. The illumination device (1) as claimed in claim 1, characterized in that the heat sink (4) has at least two linear recesses (6).

4. The illumination device (1) as claimed in claim 1, characterized in that at least two linear recesses (6) are parallel.

5. The illumination device (1) as claimed in claim 1, characterized in that at least one linear recess (6) is formed in rectilinear fashion at least in sections.

6. The illumination device (1) as claimed in claim 3, characterized in that at least two linear recesses (6) have at least one point of intersection.

7. The illumination device (1) as claimed in claim 2, characterized in that the at least two segments (8) of the heat sink (4) which are completely separated from one another are connected to a common basic body (9).

8. The illumination device (1) as claimed in claim 2, characterized in that at least one segment (8) of the heat sink (4) and the common basic body (9) are formed in one piece.

9. The illumination device (1) as claimed in claim 2, characterized in that the linear dimensions of a segment (8) of the heat sink (4) in the connecting plane with respect to the substrate plate (2) independently of the measurement direction are less than 20 mm.

10. The illumination device (1) as claimed in claim 2, characterized in that at least one of the segments (8) is connected to the basic body (9) by means of a mechanical connecting element.

11. The illumination device (1) as claimed in claim 2, characterized in that at least one of the segments (8) is connected to the basic body (9) by means of an adhesive bonding connection (10).

12. The illumination device (1) as claimed in claim 2, characterized in that at least one segment (8) of the heat sink (4) has a rectangular, in particular square, outer contour in the connecting plane with respect to the substrate plate (2).

13. The illumination device (1) as claimed in claim 2, characterized in that at least one segment (8) of the heat sink (4) has an elliptical, outer contour in the connecting plane with respect to the substrate plate (2).

14. An illumination device (1) comprising at least one substrate plate (2), at least one luminous element (3) arranged on a front side (A) of the substrate plate (2), and at least one heat sink (4) connected, to a rear side (B) of the substrate plate (2) over a large area, wherein the coefficients of thermal expansion of substrate plate (2) and heat sink (4) differ at least by the factor 1.5, characterized in that at least one segment (6) of the heat sink (4) which is not connected to the substrate plate (2).

15. An illumination device (1) comprising at least one substrate plate (2), at least one luminous element (3) arranged on a front side (A) of the substrate plate (2), and at least one heat sink (4) connected to a rear side (B) of the substrate plate (2) over a large area, wherein the coefficients of thermal expansion of substrate plate (2) and heat sink (4) differ at least by the factor 1.5, characterized in that at least one segment (8) of the heat sink (4) is formed in approximately U-shaped fashion, wherein the opening (13) of the U is remote from the substrate plate (2).

16. An illumination device (1) comprising at least one substrate plate (2), at least one luminous element (3) arranged on a front side (A) of the substrate plate and at least one heat sink (4) connected, to a rear side (B) of the substrate plate (2) over a large area, wherein the coefficients of thermal expansion of substrate plate (2) and heat sink (4) differ at least by the factor 1.5, characterized in that the heat sink (4) is formed at least partly from bent sheet metal.

17. The illumination device (1) as claimed in claim 1, characterized in that the heat sink (4) is formed substantially from aluminum and/or an aluminum alloy.

18. The illumination device (1) as claimed in claim 1, characterized in that the heat sink (4) is formed substantially from copper and/or a copper alloy.

19. The illumination device (1) as claimed in claim 1, characterized in that the substrate plate (2) is formed substantially from $Al_2O_3$ and/or AlN.

20. The illumination device as claimed in claim 1 wherein
  the substrate plate is a ceramic substrate plate;
  the at least one luminous element is a light emitting diode(s);
  the heat sink is metallic and is connected to the rear side by being adhesively bonded and/or soldered; and
  the coefficient of thermal expansion differs by a factor greater than 2.

21. The illumination device (1) as claimed in claim 13, characterized in that the elliptical outer contour in the connecting plane with respect to the substrate plate (2) is circular.

* * * * *

UNITED STATES PATENT AND TRADEMARK OFFICE
CERTIFICATE OF CORRECTION

PATENT NO.       : 7,957,146 B2                                                  Page 1 of 1
APPLICATION NO.  : 12/290765
DATED            : June 7, 2011
INVENTOR(S)      : Robert Kraus It is certified that error appears in the above-identified patent and that said Letters Patent is hereby corrected as shown below:

On the Title page:

Under Item (75) Inventors:

change "Straub" to --Strauß--.

Signed and Sealed this
Nineteenth Day of June, 2012

David J. Kappos
*Director of the United States Patent and Trademark Office*